United States Patent
Pillai et al.

(10) Patent No.: US 7,956,628 B2
(45) Date of Patent: Jun. 7, 2011

(54) CHIP-BASED PROBER FOR HIGH FREQUENCY MEASUREMENTS AND METHODS OF MEASURING

(75) Inventors: Edward R. Pillai, Wappingers Falls, NY (US); Erik J. Breiland, Colchester, VT (US); Ullrich R. Pfeiffer, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 754 days.

(21) Appl. No.: 11/556,262

(22) Filed: Nov. 3, 2006

(65) Prior Publication Data

US 2008/0106277 A1 May 8, 2008

(51) Int. Cl.
*G01R 31/20* (2006.01)
(52) U.S. Cl. .................................. 324/754.07
(58) Field of Classification Search ........... 324/754, 324/761–762, 763, 765, 158.1; 257/48; 438/14–18
See application file for complete search history.

(56) References Cited

U.S. PATENT DOCUMENTS

| | | | |
|---|---|---|---|
| 5,051,373 A | 9/1991 | Yamada et al. | 437/8 |
| 5,124,931 A | 6/1992 | Iwamatsu et al. | 364/489 |
| 5,172,053 A | 12/1992 | Itoyama | 324/158 |
| 5,220,278 A | 6/1993 | Sekii | 324/158 |
| 6,096,580 A | 8/2000 | Iyer et al. | 438/132 |
| 6,130,546 A | 10/2000 | Azizi | |
| 6,141,245 A | 10/2000 | Bertin et al. | 365/185.05 |
| 6,323,535 B1 | 11/2001 | Iyer et al. | 257/529 |
| 6,346,846 B1 | 2/2002 | Bertin et al. | 327/525 |
| 6,388,305 B1 | 5/2002 | Bertin et al. | 257/530 |
| 6,396,120 B1 | 5/2002 | Bertin et al. | 257/530 |
| 6,396,121 B1 | 5/2002 | Bertin et al. | 257/530 |
| 6,433,404 B1 | 8/2002 | Iyer et al. | 257/529 |
| 6,498,056 B1 | 12/2002 | Motsiff et al. | 438/131 |
| 6,570,207 B2 | 5/2003 | Hsu et al. | 257/302 |
| 6,577,156 B2 | 6/2003 | Anand et al. | 326/37 |
| 6,621,324 B2 | 9/2003 | Fifield et al. | 327/525 |
| 6,624,031 B2 | 9/2003 | Abadeer et al. | 438/268 |
| 6,624,499 B2 | 9/2003 | Kothandaraman et al. | 257/529 |
| 6,633,055 B2 | 10/2003 | Bertin et al. | 257/173 |

(Continued)

FOREIGN PATENT DOCUMENTS

CN 1449498 A 10/2003

(Continued)

OTHER PUBLICATIONS

Franz Sischka, "*VNA Standard Calibration Techniques and Verification*," IVNACAL.doc, Apr. 22, 2002, pp. 1-22.

(Continued)

*Primary Examiner* — Ha Tran T Nguyen
*Assistant Examiner* — Tung X Nguyen
(74) *Attorney, Agent, or Firm* — Ohlandt, Greeley, Ruggiero & Perle, LLP; Joseph P. Abate, IBM Atty.

(57) ABSTRACT

A chip-based prober for measuring a device-under-test is provided. The prober includes a probe tip, a voltage and control connector, a chip carrier, and a programmable termination chip. The probe tip is configured to contact the device-under-test. The voltage and control connector is in electrical communication with the probe tip. The programmable termination chip has a plurality of terminations interconnected with the voltage and control connector and the chip carrier through controlled collapsed chip connections.

21 Claims, 4 Drawing Sheets

U.S. PATENT DOCUMENTS

| | | | |
|---|---|---|---|
| 6,657,455 B2 * | 12/2003 | Eldridge et al. | 324/765 |
| 6,674,293 B1 | 1/2004 | Tsironis | |
| 6,677,774 B2 | 1/2004 | Buffet et al. | |
| 6,753,590 B2 | 6/2004 | Fifield et al. | 257/529 |
| 6,794,726 B2 | 9/2004 | Radens et al. | 257/530 |
| 6,879,021 B1 | 4/2005 | Fitfield et al. | 257/530 |
| 6,882,027 B2 | 4/2005 | Brintzinger et al. | 257/530 |
| 6,911,814 B2 * | 6/2005 | Miller et al. | 324/158.1 |
| 6,957,405 B2 | 10/2005 | Saunders et al. | 716/4 |
| 6,972,614 B2 | 12/2005 | Anderson, II et al. | 327/525 |
| 7,015,710 B2 | 3/2006 | Yoshida et al. | 324/754 |
| 7,046,027 B2 * | 5/2006 | Conner | 324/765 |
| 7,109,736 B2 * | 9/2006 | Long | 324/765 |
| 2004/0123994 A1 | 7/2004 | Hohenwater et al. | 174/36 |
| 2005/0174131 A1 | 8/2005 | Miller | 324/754 |
| 2006/0035404 A1 | 2/2006 | Saunders et al. | 438/100 |

FOREIGN PATENT DOCUMENTS

| | | |
|---|---|---|
| CN | 1816751 | 9/2006 |
| WO | WO03052437 A3 | 6/2003 |

OTHER PUBLICATIONS

"*Mechanical Layout Rules for Infinity Probes*," Cascade Microtech Inc., Oregon, 2004, pp. 1-6.

"*Applying Error Correction to Network Analyzer Measurements*," Agilent Technologies, Mar. 27, 2002, pp. 1-16.

Pfeffier et al. "*A Recursive Un-Termination Method for Non-Destructive In-Situ S-Parameter Measurement of Hermetically Encapsulated Packages*," IEEE vol. X, Aug. 11, 2004, pp. 1-11.

Application No. 200710167615.3, Filing Date: Oct. 23, 2007, Applicant: Edward R. Pillai, et al., 1st Office Action.

Office Action dated Feb. 9, 2011 corresponding to Chinese Patent Application No. 100022 (with English abstract).

* cited by examiner

CHIP-BASED PROBER FOR HIGH FREQUENCY MEASUREMENTS AND METHODS OF MEASURING

BACKGROUND OF INVENTION

The present disclosure relates to chip-based probers for high frequency measurements and methods of measuring. More particularly, the present disclosure relates to chip-based probers and methods of using.

The use of test equipment such as vector network analyzers (VNA) is becoming increasingly important during the design of integrated circuit (IC) devices and other electronic components. Here, the test equipment is used for modeling and characterization of a particular device-under-test (DUT).

Measurements of the device-under-test at high frequency require very precise calibration. Unfortunately, the interface devices (e.g., cables, connectors, probers, etc) that interface or connect the device-under-test to the test equipment can make parasitic contributions (e.g., capacitive effects, inductive effects, signal attenuation, etc.) that distort the signal being measured.

In order to account for the parasitic contributions of the interface devices, it is becoming common to perform a calibration that principally moves the measurement reference plane from the test equipment to the device-under-test, effectively bypassing the unwanted effects of the interface devices. One known calibration technique uses a set of electrical standards to move the measurement reference plane to the device-under-test. Here, an open circuit, a short circuit, and 50 Ohm Load standard are measured and the results are used to solve a set of simultaneous equations, whose solution is able to identify the error term needed to move the measurement reference plane.

Generally, the measurement of the device-under-test is carried out using either connectors or radio frequency (RF) probers at an interface of the device-under-test. In both cases, external calibration standards are measured in order to be able to move the reference plane of measurement to the device-under-test from the testing equipment.

Unfortunately, the use of RF probers has several shortcomings. For example, the cost of RF probers can be excessive and the probers themselves are very fragile and can be damaged easily. The RF probers are also limited to a finite number of calibration standards, typically including short, open, and load. Further, the behavior of RF probers can change with frequency and the load can start to look like a short, degrading the calibration. In addition, the large number of times the RF probers is contacted and removed for each of the calibration standards adds uncertainty and leads to calibration inaccuracy as well as reduction in probers lifetime due to the fragile nature of the RF probers.

Moreover, it has been determined that even after calibration with RF probers, some unaccounted parasitic effects in the probers and/or connector can degrade the calibration at high frequency.

Accordingly, there is a continuing need for chip-based probers that overcome, alleviate, and/or mitigate one or more of the aforementioned and other drawbacks and deficiencies of prior art chip-based probers for high frequency measurements.

BRIEF DESCRIPTION OF THE INVENTION

A chip-based prober for measuring a device-under-test is provided. The prober includes a probe tip, a voltage and control connector, a chip carrier, and a programmable termination chip. The probe tip is configured to contact the device-under-test. The voltage and control connector is in electrical communication with the probe tip. The programmable termination chip has a plurality of terminations interconnected with the voltage and control connector and the chip carrier through controlled collapsed chip connections.

A method of measuring a device-under-test is also provided. The method includes using a plurality of programmable terminations integrated in a chip-based prober to measure a high frequency measurement of the device-under-test.

A method of calibrating a chip-based prober is also provided, which includes digitally selecting one of a plurality of calibration standards resident on a circuit of the chip-based prober.

A circuit to reduce parasitics of programmable termination in a chip-based prober is provided. The circuit includes at least two biploar transistors in parallel.

The above-described and other features and advantages of the present disclosure will be appreciated and understood by those skilled in the art from the following detailed description, drawings, and appended claims.

DETAILED DESCRIPTION OF THE INVENTION

Figure 1:
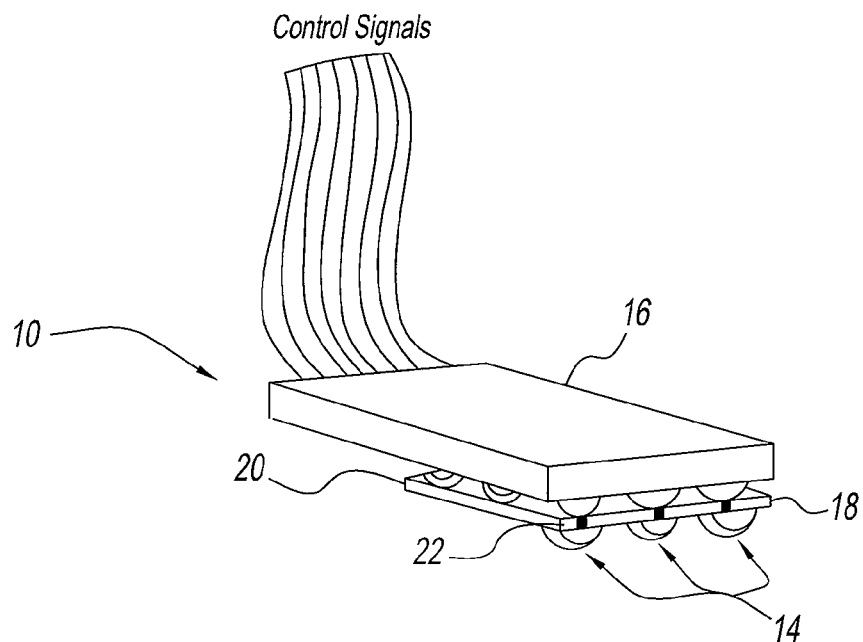
FIG. 1 is a perspective view of an exemplary embodiment of a chip-based prober according to the present disclosure.
Figure 2:
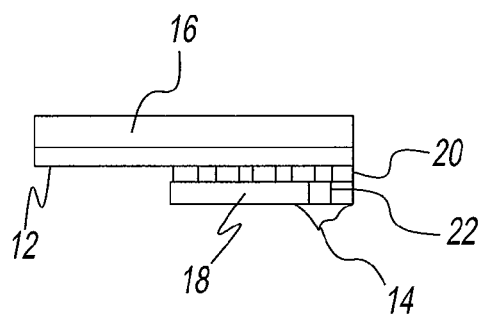
FIG. 2 is a sectional view of the chip-based prober of FIG. 1.
Figure 3:
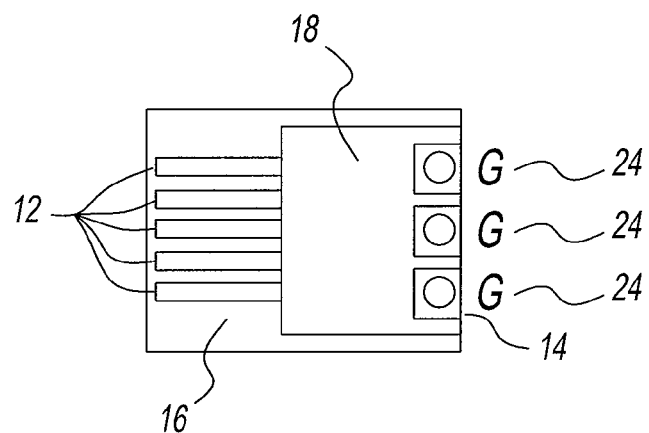
FIG. 3 is a bottom view of the chip-based prober of FIG. 1

Referring to the drawings and in particular to FIGS. 1 through 3, an exemplary embodiment of a chip-based prober according to the present disclosure, generally referred to by reference numeral 10, is shown. Advantageously, chip-based prober 10 uses a programmable termination chip as a non-RF probe.

Chip-based prober 10 includes a DC voltage and control connector 12 in electrical communication with a probe tip 14. Probe tip 14 includes a plurality of probe contact pads 24. In the illustrated embodiment, pads 24 are arranged in a typical ground-signal-ground (GSG) configuration. Of course, it is contemplated by the present disclosure for probe tip 14 to have pads 24 of any desired configuration.

Accordingly, chip-based prober 10 does not need a high cost RF connector. Rather, connector 12 is in electrical communication with a chip carrier 16 and a programmable termination chip 18. In an exemplary embodiment, chip carrier 16 is a printed circuit board. Chip 18 includes a plurality of calibration standards resident thereon, where the desired calibration standard is digitally selectable via connector 12.

Chip 18 includes a plurality of terminations (not shown) interconnected with connector 12 and board 16 through connections 20. Preferably, connections 20 are provided by a simple connection system such as, but not limited to, controlled collapsed chip connections (C4), pin connections, and others. Additionally, chip 18 is interconnected with tip 14 by way of a through wafer via 22.

In this manner, chip-based prober 10 is a low cost chip based non-RF prober that can be used to selectively replace the prior art high cost RF probes used in high frequency measurements. For example, chip-based prober 10 finds use in high frequency measurements such as, but not limited to, detection of Scattering parameters (S-parameters) and Time Domain Reflectometry (TDR).

In addition, chip-based prober 10 uses more than the typical number of calibration standards, which are designed on chip 18 and are switchable digitally in order to calibrate and measure up to frequencies of 110 GHz and beyond.

Chip 18 allows the plurality of terminations of chip-based prober 10 to be selectively programmable so that S-parameters can easily be measured with very high accuracy at millimeter-wave (mmWave) frequencies. Chip 18 also allows the terminations to be integrated into chip-based prober 10 so that S-parameters can easily be measured with very high accuracy at mmWave frequencies. Preferably, probe tip 14 is directly attached to chip 18 by through wafer vias 22.

Figure 4:
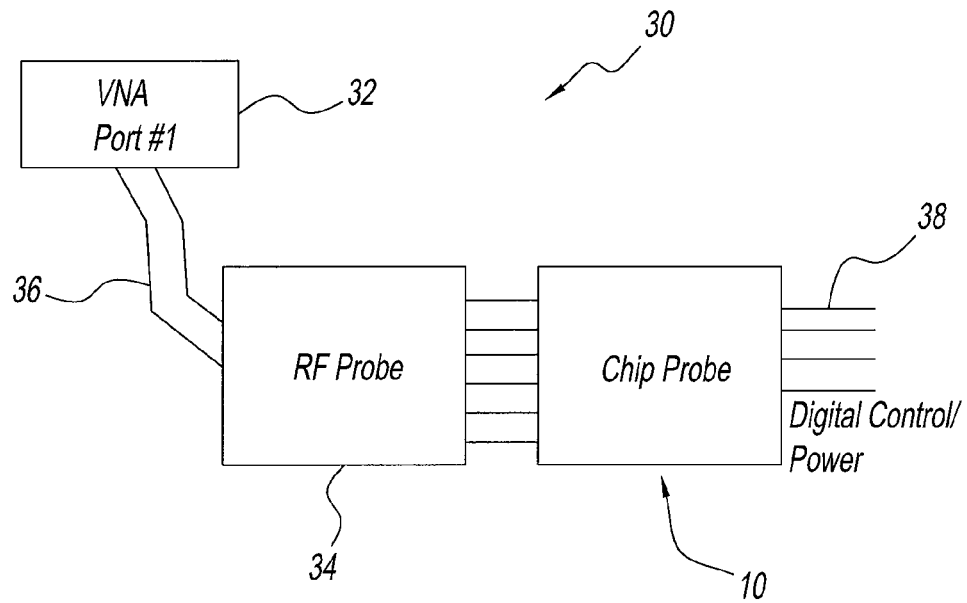
FIG. 4 illustrates the chip-based prober of FIG. 1 during characterization on the chip-based prober terminations.

An exemplary embodiment of a method 30 for characterizing chip-based prober 10 according to the present disclosure is shown in FIG. 4. Here, chip-based prober 10 is characterized as different calibration standards are switched in to chip 18. During method 30, chip-based prober 10 is connected in electrical communication to a vector network analyzer (VNA) 32 and an RF test prober 34 across a through-line 36. Chip-based prober 10 is measured by RF test prober 32 to characterize the prober terminations, including parasitics.

More particularly, the electrical path from C4 connections 20 to the calibration standard on chip 18 have a parasitic associated with it. Before measurement of a device-under-test, method 30 can be used to characterize the parasitic associated with chip-based prober 10. For example, VNA 32 and RF prober 34 can be used to measure chip-based prober 10, while its standards are switched in, across through-line 36 to characterize the probe's parasitic so that the parasitic becomes a known term in addition to the terminations on chip themselves.

Advantageously, chip-based prober 10 can be used in conjunction with standard RF probes in the measurement of two-port and four-port devices-under-test (DUT). In this manner, chip-based prober 10 can take the place of one or more of the more costly and less accurate RF probes.

For example, when measuring a two-port DUT one RF prober and one chip-based prober 10 can be used along with one two-port VNA. Here, the second RF prober typically used in prior art measurements can be replaced with chip-based prober 10.

Figure 5:
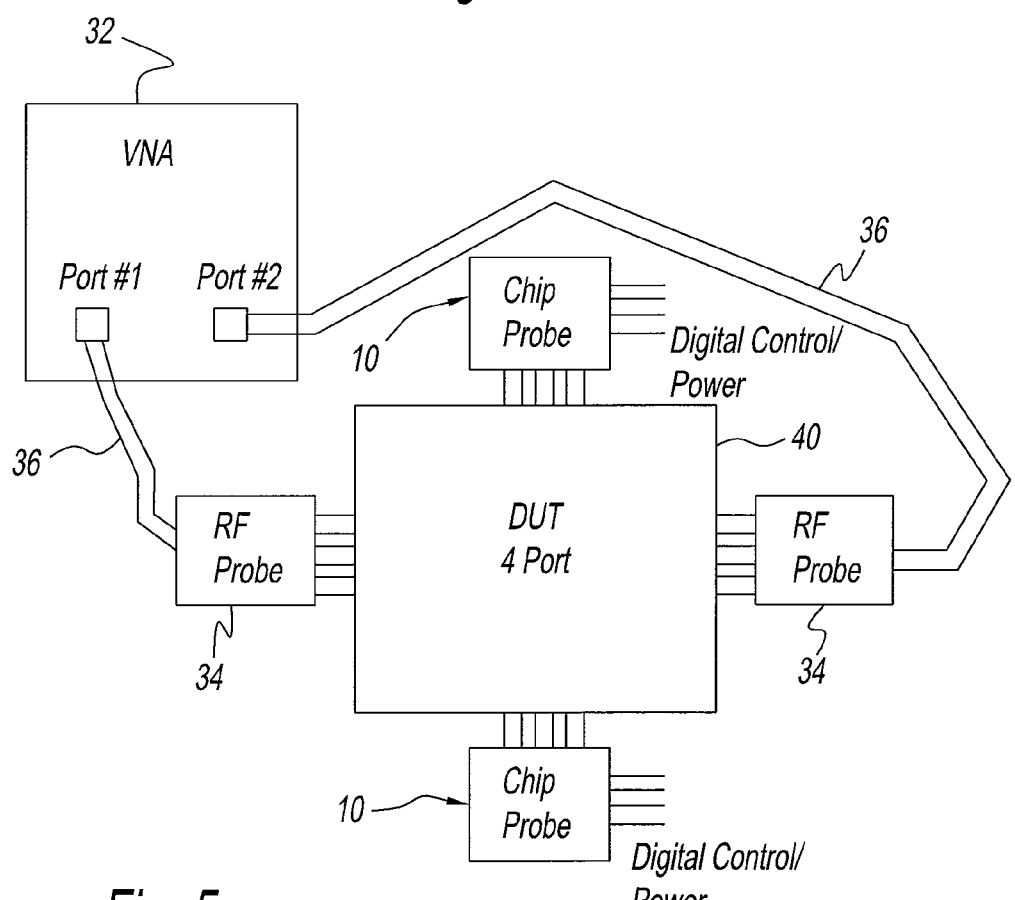
FIG. 5 illustrates the chip-based prober of FIG. 1 in use with a two-port vector network analyzer while measuring a four-port device-under-test.

Further, chip-based prober 10 can be used during measurement of a four-port DUT 40 as shown in FIG. 5. Typically, measurement of a four-port DUT 40 requires two, two-port VNA's, which is cost prohibitive. Advantageously, chip-based prober 10 enables the measurement of four-port DUT 40 with a single two-port VNA 32.

Here, two RF probes 34 and two chip-based probers 10 are needed for four-port measurement. Accordingly, chip-based prober 10 enables the use of the less costly two-port VNA when performing four-port measurement, which can be a significant saving.

During measurement of a device-under-test as shown in FIG. 5, RF probers 34 are placed on each port of the two-port VNA 32, in turn, while chip-based probers 10 are placed on the other port of the VNA, in turn. When using chip-based probers 10, several measurements can be taken with several terminating standards by digitally selecting the desired standard in the chip-based prober, giving a whole series of automatic measurements. Once the series of measurements have been taken, an algorithm can then be used to produce a highly accurate DUT measurement matrix up to frequencies of 110 GHz and beyond.

It should be recognized that chip-based prober 10 is illustrated in FIG. 5 by way of example in use with a single two-port VNA. However, it is contemplated by the present disclosure for chip-based prober 10 to find use in any measurement configuration (n-port) including a two-port measurement.

Figure 6:
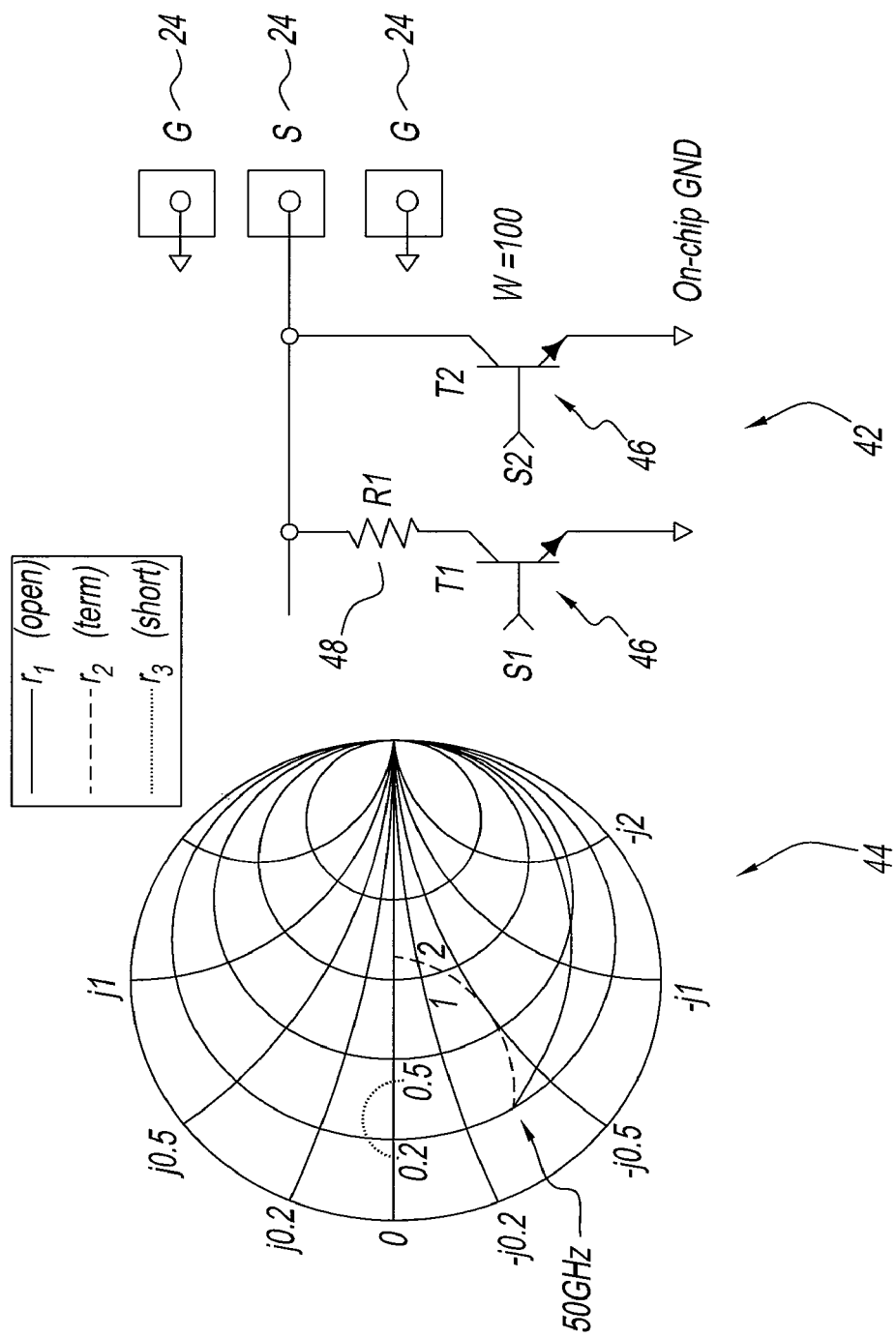
FIG. 6 illustrates an exemplary embodiment of a circuit diagram of the chip-based prober of FIG. 1 and a corresponding Smith chart of impedances.

As discussed above, chip 18 of chip-based prober 10 includes a plurality of calibration standards, which are designed on and are switchable digitally. Referring now to FIG. 6, an exemplary embodiment of a circuit 42 on chip 18 is shown. Circuit 42 is configured to allow one of a plurality of calibration standards to be digitally selected. Additionally, FIG. 6 provides a corresponding Smith chart 44 illustrating the resulting impedances available from circuit 42.

Apart from the usual short, open and load several other circuit 42 includes impedances additional impedances that are all selectable digitally. Circuit 42 is designed to switch in different standards and to obtain impedances that don't meet until very high frequency. By keeping the impedances apart as shown in Smith chart 44, greater accuracy in the characterization of chip-based prober 10 is attainable as compared to prior art probes.

In the embodiment illustrated in FIG. 6, circuit 42 includes at least two biploar transistors 46 in parallel and a resistor 48. Here, the desired impedance is digitally selectable through the control of transistors 46 and resistor 48 via connector 12. Of course, it is contemplated by the present disclosure for circuit 42 as many transistors 46 as are desired for a particular application or use.

Figure 7:
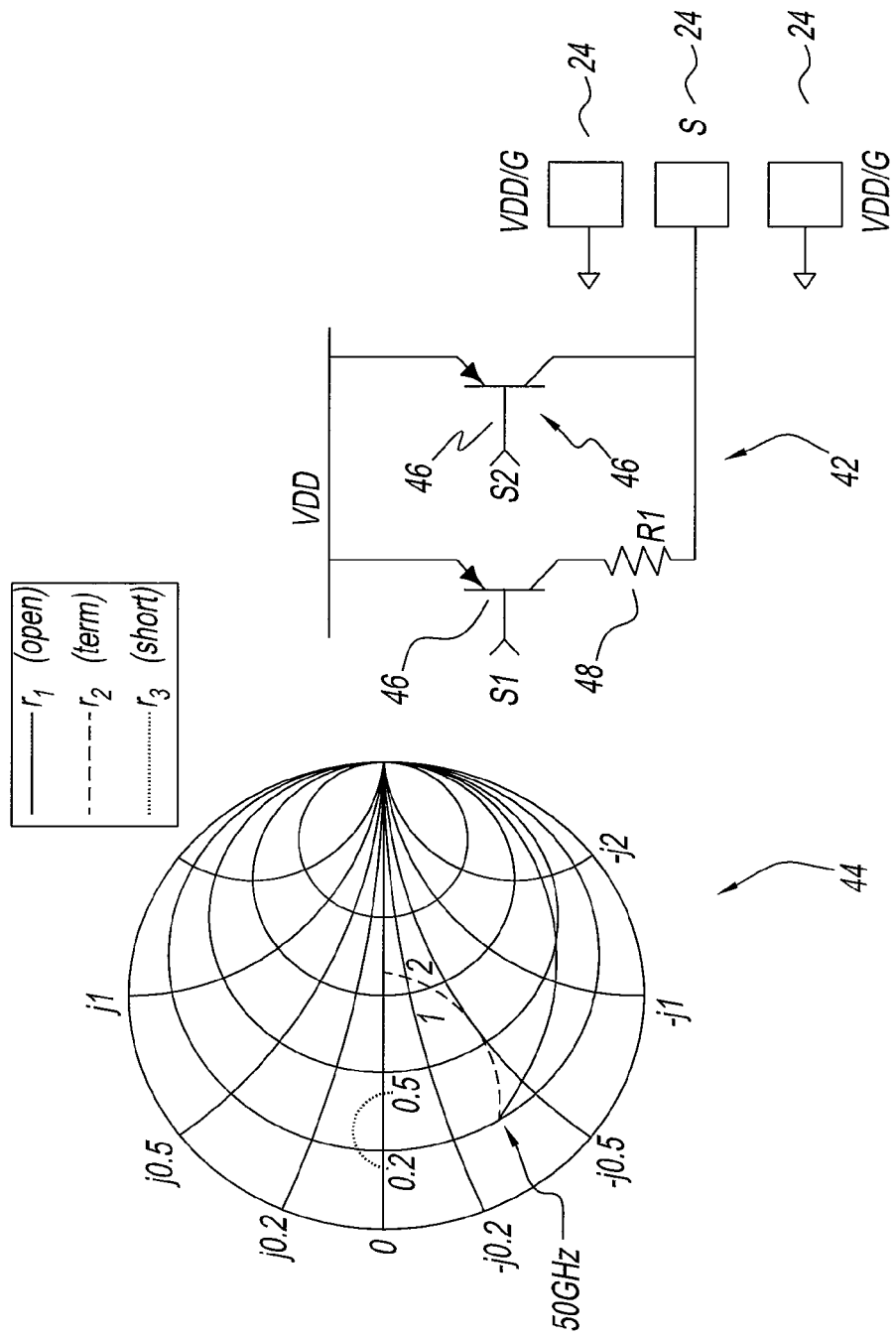
FIG. 7 illustrates an alternate exemplary embodiment of a circuit diagram of the chip-based prober of FIG. 1 and a corresponding Smith chart of impedances.

In the embodiment of circuit 42 illustrated in FIG. 7, the circuit includes at least two biploar transistors 46 in series. Preferably, one of the bipolar transistors is scaled in size, so as to provide a different on-resistance as compared to the other bipolar transistor. It has been found by the present disclosure that circuit 42, in this embodiment, provides terminations that show very little parasitic effects and on-chip wires, e.g. in the connection of the resistor with the bipolar devices are avoided.

Of course, it should be noted that circuit 42 is illustrated by way of example only having biploar transistors 46. However, it is contemplated by the present disclosure for one or more of transistors 46 to be field effect transistors (FET) such as, but not limited to, n-FET transistors, p-FET transistors, PNP transistors, and other types of transistors that are resident on chip 18.

During characterization of chip-based prober 10 discussed above, the extra impedances provided by circuit 42 allow for obtaining several extra simultaneous equations to identify the calibration error terms of chip-based prober 10 and, thus, enables one to keep calibration impedances away from each other on the Smith chart and attain calibration and measurement up to frequencies of 110 GHz.

Additionally, digital selection of the impedances through circuit 42 means that chip-based prober 10 does not have to be attached and reattached during characterization method 30. Thus, characterization method 30 avoids the uncertainty in the calibration and probe-aging present with prior art prober characterization methods. Preferably, chip-based prober 10 use power from DC voltage and control connector 12 for switching in the on-chip standards.

Once the measurements are complete, an algorithm can be implemented to extract the DUT four-port data up to very high frequencies. In this manner, chip-based prober 10, at a minimum, enables four-port measurement of S-parameters of a device-under-test up to 110 GHz and, in some embodiments into mmWave frequencies.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims.

What is claimed is:

1. A chip-based prober for measuring a device-under-test, comprising:
   a probe tip for contact with the device-under-test;
   a voltage and control connector in electrical communication with said probe tip;
   a chip carrier;
   a programmable termination chip having a plurality of terminations interconnected with said voltage and control connector and said chip carrier through controlled collapsed chip connections; and
   a plurality of calibration standards resident on said programmable termination chip.

2. The chip-based prober as in claim 1, wherein said programmable termination chip is interconnected with said probe tip by a through wafer via.

3. The chip-based prober as in claim 1, wherein said controlled collapsed chip connections are interconnected with said probe tip by a through wafer via.

4. The chip-based prober as in claim 1, wherein the chip-based prober finds use in high frequency measurements selected from the group consisting of Scattering parameters, Time Domain Reflectometry, and any combinations thereof.

5. The chip-based prober as in claim 1, wherein said probe tip comprises a plurality of probe contact pads.

6. The chip-based prober as in claim 5, wherein said plurality of probe contact pads are arranged in a ground-signal-ground configuration.

7. The chip-based prober as in claim 1, wherein said plurality of calibration standards are digitally selectable via said voltage and control connector.

8. The chip-based prober as in claim 1, wherein said plurality of calibration standards are configured to calibrate and measure up to frequencies of about 110 GHz.

9. The chip-based prober as in claim 1, wherein said plurality of calibration standards are configured to calibrate and measure up to millimeter-wave frequencies.

10. The chip-based prober as in claim 1, wherein said plurality of terminations are integrated in said programmable termination chip.

11. The chip-based prober as in claim 1, wherein said probe tip are directly attached to said programmable termination chip.

12. The chip-based prober as in claim 1, further comprising a circuit to reduce parasitics of programmable termination resident on said programmable termination chip.

13. The chip-based prober as in claim 12, wherein said circuit comprises at least two biploar transistors in parallel.

14. A method of measuring a device-under-test, comprising:
    using a plurality of programmable terminations integrated in a chip-based prober to measure a high frequency measurement of the device-under-test; and
    programming a plurality of calibration standards on a programmable termination chip of said chip-based prober for calibrating said plurality of programmable terminations.

15. The method as in claim 14, wherein said high frequency measurement is selected from the group consisting of Scattering parameters, Time Domain Reflectometry, and any combinations thereof.

16. The method as in claim 14, wherein said high frequency measurement is measured at a frequency of up to about 110 GHz.

17. The method as in claim 14, further comprising using said plurality of programmable terminations to measure more than one port of the device-under-test.

18. The method as in claim 14, further comprising using said plurality of programmable terminations to measure four-ports of the device-under-test.

19. A method of calibrating a chip-based prober, comprising:
    digitally selecting one of a plurality of calibration standards resident on a circuit of the chip-based prober.

20. The method as in claim 19, wherein said plurality of calibration standards comprises a plurality of digitally selectable impedances.

21. The method as in claim 19, further comprising obtaining a plurality of simultaneous equations to identify calibration error terms of the chip-based prober.

* * * * *